United States Patent
Kawahara et al.

(10) Patent No.: US 11,888,057 B2
(45) Date of Patent: Jan. 30, 2024

(54) SEMICONDUCTOR DEVICE

(71) Applicant: Mitsubishi Electric Corporation, Tokyo (JP)

(72) Inventors: Kotaro Kawahara, Tokyo (JP); Shiro Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 489 days.

(21) Appl. No.: 17/293,916

(22) PCT Filed: Nov. 30, 2018

(86) PCT No.: PCT/JP2018/044153
§ 371 (c)(1),
(2) Date: May 14, 2021

(87) PCT Pub. No.: WO2020/110285
PCT Pub. Date: Jun. 4, 2020

(65) Prior Publication Data
US 2022/0013663 A1    Jan. 13, 2022

(51) Int. Cl.
*H01L 29/78* (2006.01)
*H01L 29/10* (2006.01)
*H01L 29/16* (2006.01)

(52) U.S. Cl.
CPC ...... *H01L 29/7806* (2013.01); *H01L 29/1095* (2013.01); *H01L 29/1608* (2013.01)

(58) Field of Classification Search
None
See application file for complete search history.

(56) References Cited

U.S. PATENT DOCUMENTS

| 8,003,991 | B2 | 8/2011 | Yatsuo et al. |
| 8,835,934 | B2 | 9/2014 | Mizukami |
| 9,214,458 | B2 | 12/2015 | Hino et al. |
| 9,887,285 | B1 | 2/2018 | Oota et al. |
| 10,290,732 | B2* | 5/2019 | Matocha ......... H01L 21/823412 |
| 11,355,627 | B2* | 6/2022 | Nagahisa ......... H01L 29/66712 |
| 2011/0049564 | A1 | 3/2011 | Guan et al. |
| 2012/0061688 | A1 | 3/2012 | Watanabe et al. |

(Continued)

FOREIGN PATENT DOCUMENTS

| JP | 4900662 B2 | 3/2012 |
| JP | 2013-048230 A | 3/2013 |

(Continued)

OTHER PUBLICATIONS

International Search Report and Written Opinion dated Feb. 19, 2019, received for PCT Application No. PCT/JP2018/044153, Filed on Nov. 30, 2018, 9 pages including English Translation.

*Primary Examiner* — Michelle Mandala
(74) *Attorney, Agent, or Firm* — XSENSUS LLP

(57) ABSTRACT

A technique for maintaining maximum unipolar current density while improving I2t tolerance is provided. In a semiconductor device, a first impurity layer and a Schottky interface are formed to sandwich a well layer therebetween. A first impurity layer is formed from an outermost layer of the well layer located closer to the Schottky interface than a source layer to below the source layer. The lower face of the first impurity layer is located below the Schottky interface.

13 Claims, 6 Drawing Sheets

(56) References Cited

U.S. PATENT DOCUMENTS

| | | | |
|---|---|---|---|
| 2013/0270637 A1* | 10/2013 | Komatsu | H01L 29/0847 |
| | | | 257/339 |
| 2014/0048847 A1 | 2/2014 | Yamashita et al. | |
| 2015/0236012 A1* | 8/2015 | Hino | H01L 29/7806 |
| | | | 257/77 |
| 2015/0279983 A1 | 10/2015 | Tanaka et al. | |
| 2016/0043169 A1 | 2/2016 | Guan et al. | |
| 2017/0213887 A1 | 7/2017 | Guan et al. | |
| 2018/0212022 A1 | 7/2018 | Guan et al. | |

FOREIGN PATENT DOCUMENTS

| | | |
|---|---|---|
| JP | 5739813 B2 | 6/2015 |
| JP | 2015-185700 A | 10/2015 |
| JP | 5815882 B2 | 11/2015 |
| JP | 2016-167538 A | 9/2016 |
| JP | 2017-168561 A | 9/2017 |
| JP | 2018-049951 A | 3/2018 |
| WO | 2011/007387 A1 | 1/2011 |
| WO | 2014/038110 A1 | 3/2014 |

* cited by examiner

SEMICONDUCTOR DEVICE

CROSS-REFERENCE TO RELATED APPLICATION

The present application is based on PCT filing PCT/JP2018/044153, filed Nov. 30, 2018, the entire contents of which are incorporated herein by reference.

TECHNICAL FIELD

A technique disclosed in the specification of the present application relates to, for example, a semiconductor device using silicon carbide (SiC).

BACKGROUND ART

Conventionally, there is a method in which a silicon carbide semiconductor device such as a metal-oxide-semiconductor field-effect transistor (i.e., MOSFET) using silicon carbide (SiC) includes a Schottky barrier diode (i.e., SBD) in order to avoid bipolar deterioration caused by the flow of return current through a body diode (for example, see Patent Document 1).

A technique also has been proposed in which a trench is formed in order to reduce chip area and an SBD is formed on the bottom of the trench (for example, see Patent Document 2).

PRIOR ART DOCUMENTS

Patent Documents

Patent Document 1: Japanese Patent Publication No. 5815882
Patent Document 2: Japanese Patent Application Laid-Open No. 2015-185700

SUMMARY

Problem to be Solved by the Invention

Semiconductor devices are required not to be broken for a fixed period of time even if a large return current flows into the semiconductor devices. Such tolerance for not being broken for a fixed period of time is called I2t tolerance.

Meanwhile, MOSFETs including SBDs are required to have high unipolar current-carrying capabilities in order to avoid the aforementioned bipolar deterioration.

The semiconductor device disclosed in Patent Document 1 or 2 has the problem of striking a balance between I2t tolerance and the unipolar current-carrying capability for return current.

In general, unipolar current-carrying capabilities improve when the passage of current through body diodes becomes difficult in MOSFETs including SBDs. However, I2t tolerance is reduced.

On the other hand, I2t tolerance improves when the passage of current through body diodes becomes easy in MOSFETs including SBDs. However, unipolar current-carrying capabilities are reduced.

The technique disclosed in the specification of the present application has been provided in view of the problem as described above, and it is an object of the present application to provide a technique for maintaining maximum unipolar current density while improving I2t tolerance.

Means to Solve the Problem

According to a first aspect of the technique disclosed in the specification of the present application, a semiconductor device includes a semiconductor substrate of a first conductivity type, a drain electrode having ohmic contact with a lower face of the semiconductor substrate, a drift layer of the first conductivity type formed on an upper face of the semiconductor substrate, a well layer of a second conductivity type formed in part of an outermost layer of the drift layer, a source layer of the first conductivity type formed in part of an outermost layer of the well layer and having a higher impurity concentration than that of the drift layer, a first impurity layer of the second conductivity type formed in part of the outermost layer of the well layer and having a higher impurity concentration than that of the well layer, and a source electrode formed in contact with the outermost layer of the drift layer in which the well layer is not formed, the well layer, the source layer, and the first impurity layer. An interface at which the source electrode has Schottky contact with the drift layer is regarded as a Schottky interface. The first impurity layer and the Schottky interface sandwich the well layer therebetween. The first impurity layer is formed from the outermost layer of the well layer, located closer to the Schottky interface than the source layer, to below the source layer. A lower face of the first impurity layer is located below the Schottky interface.

According to a second aspect of the technique disclosed in the specification of the present application, a semiconductor device includes a drift layer of a first conductivity type, a well layer of a second conductivity type formed in part of an outermost layer of the drift layer, a source layer of the first conductivity type formed in part of an outermost layer of the well layer and having a higher impurity concentration than that of the drift layer, a first impurity layer of the second conductivity type formed in part of the outermost layer of the well layer and having a higher impurity concentration than that of the well layer, and a source electrode formed in contact with the outermost layer of the drift layer in which the well layer is not formed, the well layer, the source layer, and the first impurity layer. An interface at which the source electrode has Schottky contact with the drift layer is regarded as a Schottky interface. The first impurity layer and the Schottky interface sandwich the well layer therebetween. The first impurity layer is formed in a region that includes an inside of the well layer located farther from the Schottky interface than the source layer. A lower face of the first impurity layer is located below the Schottky interface.

According to a third aspect of the technique disclosed in the specification of the present application, a semiconductor device includes a drift layer of a first conductivity type, a first well layer of a second conductivity type formed in part of an outermost layer of the drift layer, a second well layer of the second conductivity type formed in part of the outermost layer of the drift layer, a source layer of the first conductivity type formed in part of an outermost layer of the second well layer and having a higher impurity concentration than that of the drift layer, a first impurity layer of the second conductivity type formed in part of an outermost layer of the first well layer and having a higher impurity concentration than that of the first well layer, a second impurity layer of the second conductivity type formed in part of the outermost layer of the second well layer and having a higher impurity concentration than that of the second well layer, and a source electrode formed in contact with the outermost layer of the drift layer in which the first well layer and the second well layer are not formed, the first well layer, the second well layer, the source layer, the first impurity layer, and the second impurity layer. An interface at which the source electrode has Schottky contact with the drift layer is regarded as a Schottky interface. The first impurity layer and the Schottky interface sandwich the first well layer therebetween. The second impurity layer and the Schottky interface sandwich the second well layer therebetween. The second impurity layer is formed in the outermost layer of the well layer located closer to the Schottky interface than the source layer. A lateral edge portion of the first impurity layer on a side farther from the Schottky interface is located at a position farther from the Schottky interface than a lateral edge portion of the second impurity layer on a side farther from the Schottky interface, and a lower face of the first impurity layer and a lower face of the second impurity layer are located below the Schottky interface.

Effects of the Invention

According to the first aspect of the technique disclosed in the specification of the present application, the semiconductor device includes a semiconductor substrate of a first conductivity type, a drain electrode having ohmic contact with a lower face of the semiconductor substrate, a drift layer of the first conductivity type formed on an upper face of the semiconductor substrate, a well layer of a second conductivity type formed in part of an outermost layer of the drift layer, a source layer of the first conductivity type formed in part of an outermost layer of the well layer and having a higher impurity concentration than that of the drift layer, a first impurity layer of the second conductivity type formed in part of the outermost layer of the well layer and having a higher impurity concentration than that of the well layer, and a source electrode formed in contact with the outermost layer of the drift layer in which the well layer is not formed, the well layer, the source layer, and the first impurity layer. An interface at which the source electrode has Schottky contact with the drift layer is regarded as a Schottky interface. The first impurity layer and the Schottky interface sandwich the well layer therebetween. The first impurity layer is formed from the outermost layer of the well layer, located closer to the Schottky interface than the source layer, to below the source layer. A lower face of the first impurity layer is located below the Schottky interface. According to such a configuration, a body diode interface connected from the source electrode through low resistance can be located away from the Schottky interface. Thus, it is possible to maintain maximum unipolar current density while improving I2t tolerance.

According to the second aspect of the technique disclosed in the specification of the present application, the semiconductor device includes a drift layer of a first conductivity type, a well layer of a second conductivity type formed in part of an outermost layer of the drift layer, a source layer of the first conductivity type formed in part of an outermost layer of the well layer and having a higher impurity concentration than that of the drift layer, a first impurity layer of the second conductivity type formed in part of the outermost layer of the well layer and having a higher impurity concentration than that of the well layer, and a source electrode formed in contact with the outermost layer of the drift layer in which the well layer is not formed, the well layer, the source layer, and the first impurity layer. An interface at which the source electrode has Schottky contact with the drift layer is regarded as a Schottky interface. The first impurity layer and the Schottky interface sandwich the well layer therebetween. The first impurity layer is formed in a region that includes an inside of the well layer located farther from the Schottky interface than the source layer. A lower face of the first impurity layer is located below the Schottky interface. According to such a configuration, a body diode interface connected from the source electrode through low resistance can be located away from the Schottky interface. Thus, it is possible to maintain maximum unipolar current density while improving I2t tolerance.

According to the third aspect of the technique disclosed in the specification of the present application, the semiconductor device includes a drift layer of a first conductivity type, a first well layer of a second conductivity type formed in part of an outermost layer of the drift layer, a second well layer of the second conductivity type formed in part of the outermost layer of the drift layer, a source layer of the first conductivity type formed in part of an outermost layer of the second well layer and having a higher impurity concentration than that of the drift layer, a first impurity layer of the second conductivity type formed in part of an outermost layer of the first well layer and having a higher impurity concentration than that of the first well layer, a second impurity layer of the second conductivity type formed in part of the outermost layer of the second well layer and having a higher impurity concentration than that of the second well layer, and a source electrode formed in contact with the outermost layer of the drift layer in which the first well layer and the second well layer are not formed, the first well layer, the second well layer, the source layer, the first impurity layer, and the second impurity layer. An interface at which the source electrode has Schottky contact with the drift layer is regarded as a Schottky interface. The first impurity layer and the Schottky interface sandwich the first well layer therebetween. The second impurity layer and the Schottky interface sandwich the second well layer therebetween. The second impurity layer is formed in the outermost layer of the well layer located closer to the Schottky interface than the source layer. A lateral edge portion of the first impurity layer on a side farther from the Schottky interface is located at a position farther from the Schottky interface than a lateral edge portion of the second impurity layer on a side farther from the Schottky interface, and a lower face of the first impurity layer and a lower face of the second impurity layer are located below the Schottky interface. According to such a configuration, a body diode interface connected from the source electrode through low resistance can be located away from the Schottky interface. Thus, it is possible to maintain maximum unipolar current density while improving I2t tolerance.

The objects, features, aspects and advantages of the technique disclosed in the specification of the present application will become more apparent from the following detailed description when taken into conjunction with the accompanying drawings.

DESCRIPTION OF EMBODIMENTS

Figure 1:
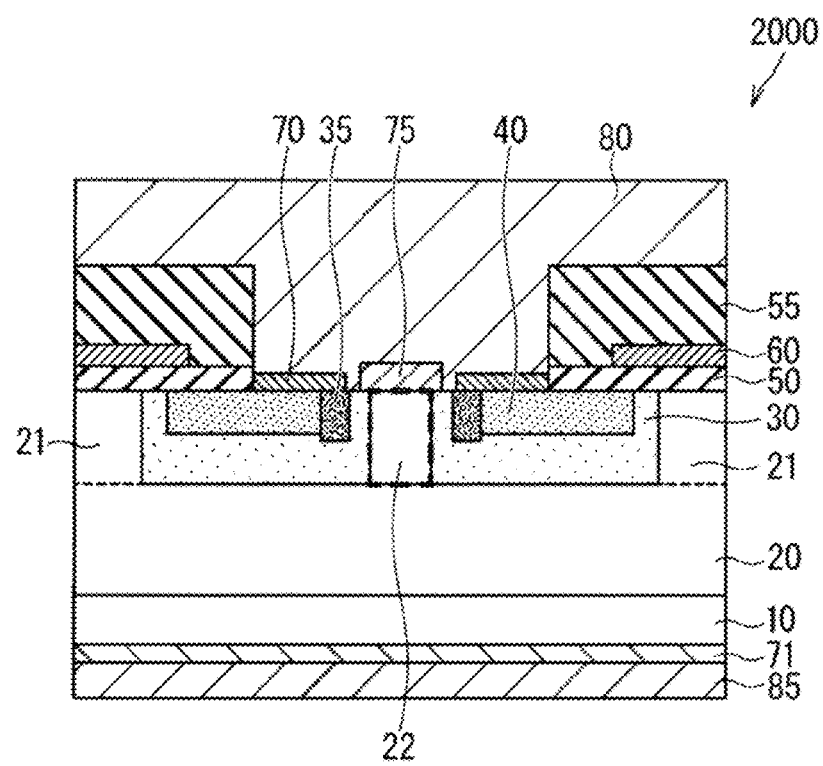
FIG. 1 is a sectional view schematically illustrating a configuration example of an active cell in a semiconductor device 2000 relating to an embodiment.

Embodiments will be described hereinafter with reference to the accompanied drawings. Exemplary effects produced by these embodiments will also be described collectively after the description of all the embodiments.

Note that the drawings are given in schematic form, and for convenience of description, configurations may be omitted or simplified appropriately. Mutual relationships in size and position among configurations or the like illustrated in different drawings are not always accurate and can be appropriately changed. To facilitate understanding of the contents of the embodiments, hatching may be given to drawings such as plan views other than sectional views.

In the following description, similar constituent elements are given the same reference signs in the illustration and assumed to have similar names and similar functions. Therefore, detailed descriptions of such constituent elements may be omitted in some cases in order to avoid redundancy.

In the following description, terms that mean specific positions and directions, such as "upper," "lower," "left," "right," "side," "bottom," "front," and "back," may be used in some cases, but these terms are merely used for the sake of convenience to facilitate understanding of the content of the embodiments and may not relate to directions at the time of actual implementation.

In the following description, the phrase such as "the upper face of" or "the lower face of" means not only the upper face itself of a target constituent element, but also means a state in which another constituent element is formed on the upper face of a target constituent element. That is, for example, the phrase "A provided on the upper face of B" does not exclude the possibility that another constituent element C exists between A and B.

In the following description, an ordinal number such as "first" or "second" may be used in some cases, but these terms are merely used for the sake of convenience to facilitate understanding of the content of the embodiments and are not intended to limit, for example, a sequence indicated by such ordinal numbers.

Although the following description gives an example of the case where a semiconductor device is made of silicon carbide (SiC), but other wide bandgap semiconductors such as gallium nitride, aluminum nitride, aluminum gallium nitride, gallium oxide, and diamond can also produce similar effects to those of the embodiments of the present invention.

Although the following description gives an example of the case where the first conductivity type is an N type and the second conductivity type is a P type, the first conductivity type may be a P type and the second conductivity type may be an N type.

First Embodiment

A semiconductor device according to the present embodiment will be described hereinafter. For the sake of convenience of description, first, a configuration of a semiconductor device 2000 according to the present embodiment will be described.

Configuration of Semiconductor Device

FIG. 1 is a sectional view schematically illustrating a configuration example of an active cell in the semiconductor device 2000 relating to the present embodiment.

As illustrated in the example in FIG. 1, the active cell in the semiconductor device 2000 includes an N-type semiconductor substrate 10, an N-type drift layer 20 formed on the upper face of the N-type semiconductor substrate 10, a P-type well layer 30 formed in part of the outermost layer of the N-type drift layer 20, an N-type source layer 40 formed in part of the outermost layer of the P-type well layer 30, a P-type well contact layer 35 formed in part of the outermost layer of the P-type well layer 30, a gate insulating film 50 formed at least in contact with the upper face of the P-type well layer 30 sandwiched between the N-type source layer 40 and the N-type drift layer 20, a gate electrode 60 formed on the upper face of the gate insulating film 50, an interlayer insulation film 55 formed to cover the gate electrode 60, an Ohmic electrode 70 formed to cover the upper face of the N-type source layer 40 that is not covered with the gate insulating film 50 and to cover part of the upper face of the P-type well contact layer 35 that is not covered with the gate insulating film 50, a Schottky electrode 75 formed to cover part of the upper face of the P-type well layer 30 that is not covered with the gate insulating film 50 and to cover the upper face of the N-type drift layer 20 that is not covered with the gate insulating film 50, a source electrode 80 formed to cover the interlayer insulation film 55 and to cover part of the upper face of the P-type well layer 30 that is not covered with the Ohmic electrode 70 and the Schottky electrode 75, a backside Ohmic electrode 71 formed on the lower face of the N-type semiconductor substrate 10, and a drain electrode 85 formed on the lower face of the backside Ohmic electrode 71.

Here, a region located in proximity to the upper face of the N-type drift layer 20 that is in contact with the source electrode 80 corresponds to a Schottky region 22.

Next, a configuration of a semiconductor device 1001 according to the present embodiment will be described.

Figure 2:
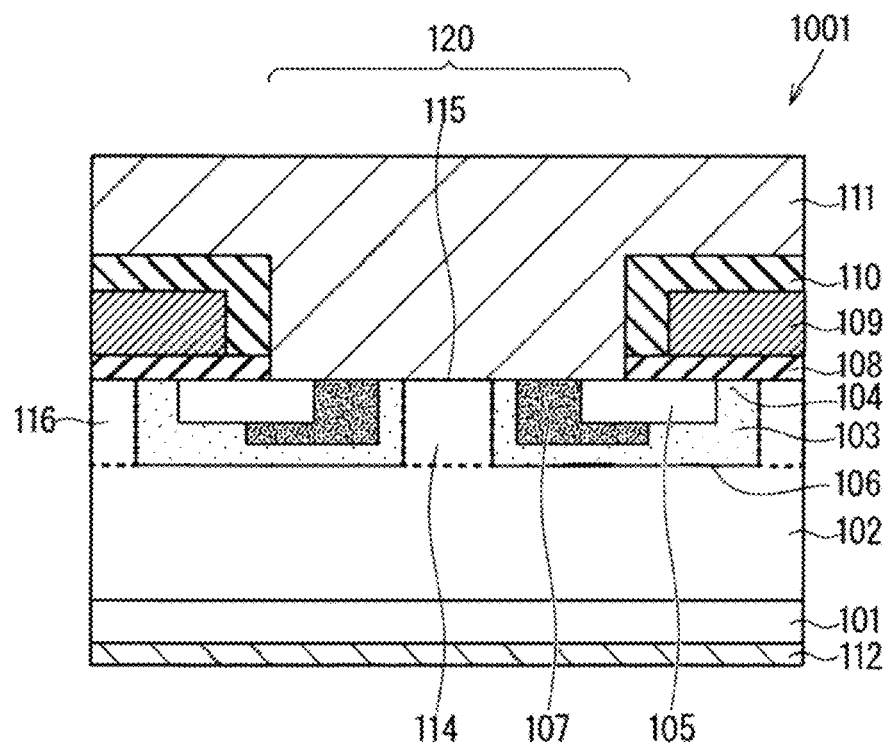
FIG. 2 is a sectional view schematically illustrating a configuration example of an active cell in a semiconductor device 1001 according to an embodiment.

FIG. 2 is a sectional view schematically illustrating a configuration example of an active cell in a semiconductor device 1001 according to the present embodiment.

As illustrated in the example in FIG. 2, the active cell in the semiconductor device 1001 includes an N-type semiconductor substrate 101, an N-type drift layer 102 formed on the upper face of the N-type semiconductor substrate 101, a P-type well layer 103 formed in part of the outermost layer of the N-type drift layer 102, an N-type source layer 105 formed in part of the outermost layer of the P-type well layer 103, a P-type low-resistance layer 107 formed in part of the outermost layer of the P-type well layer 103, a gate insulating film 108 formed at least in contact with the upper face of the P-type well layer 103 that is sandwiched between the N-type source layer 105 and the N-type drift layer 102, a gate electrode 109 formed on the upper face of the gate insulating film 108, an interlayer insulation film 110 formed to cover the gate electrode 109, a source electrode 111 formed to cover the interlayer insulation film 110, the upper face of the N-type source layer 105 that is not covered with the gate insulating film 108, the upper face of the P-type low-resistance layer 107 that is not covered with the gate insulating film 108, the upper face of the P-type well layer 103 that is not covered with the gate insulating film 108, and the upper face of the N-type drift layer 102 that is not covered with the gate insulating film 108, and a drain electrode 112 formed on the lower face of the N-type semiconductor substrate 101.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107, the upper face of the P-type well layer 103, and the upper face of the N-type drift layer 102 corresponds to a source contact hole 120.

The P-type low-resistance layer 107 is separated from the Schottky region 114 in the direction of a plane (i.e., right-left direction in FIG. 2) by the P-type well layer 103. The P-type low-resistance layer 107 exists not only on one lateral side of the N-type source layer 105 but also on the underside of the N-type source layer 105. The P-type low-resistance layer 107 may be located in contact with the side and lower faces of the N-type source layer 105, or may be located away from these faces. The lower face of the P-type low-resistance layer 107 is located below the Schottky interface 115.

In one source contact hole 120, the source electrode 111 is in contact with the P-type well layer 103, the N-type source layer 105, the P-type low-resistance layer 107, and the N-type drift layer 102 (Schottky region 114).

The source electrode 111 has Schottky contact with the Schottky region 114. The drain electrode 112 has ohmic contact with the lower face of the N-type semiconductor substrate 101.

The body diode interface 106 is an interface between the N-type drift layer 102 and the lower face of the P-type well layer 103, and also includes an interface between the N-type drift layer 102 and the lower face of the P-type low-resistance layer 107 when the lower face of the P-type low-resistance layer 107 reaches the lower end of the P-type well layer 103.

The channel region 104 is a region where a channel is formed in the P-type well layer 103 when a positive voltage is applied to the gate electrode 109 over the source electrode 111, and is also a region that is in contact with the gate insulating film 108.

The N-type semiconductor substrate 101, the N-type drift layer 102, the P-type well layer 103, the N-type source layer 105, the P-type low-resistance layer 107, the Schottky region 114, and the JFET region 116 are made of, for example, silicon carbide (SiC).

The gate insulating film 108 and the interlayer insulation film 110 are made of, for example, silicon dioxide ($SiO_2$).

The gate electrode 109 may be made of, for example, polysilicon. The source electrode 111 and the drain electrode 112 may be made of, for example, nickel, titanium, aluminum, gold, platinum, copper, or molybdenum, or made of an alloy of these materials.

Operation of Semiconductor Device

Next, the operation of the semiconductor device 1001 according to the present embodiment will be described.

A return current flowing from the source electrode 111 into the semiconductor device during normal operation flows to the drain electrode 112 through the Schottky interface 115.

On the other hand, when a large return current, e.g., a return current of 1000 $A/cm^2$ or more, flows from the source electrode 111 into the semiconductor device in an emergency, the return current flows to the drain electrode 112 not only along a path passing through the Schottky interface 115 but also along a path passing through a body diode, i.e., a path passing through the P-type low-resistance layer 107, the P-type well layer 103, and the body diode interface 106.

Functions and effects of the semiconductor device 1001 according to the present embodiment will be described hereinafter.

The I2t tolerance of an MOSFET including SBDs improves in cases where, when a large return current flows through the semiconductor device, the bipolar current density through the body diode interface 106 increases over the unipolar current density through the Schottky interface 115, and resultant injection of a large number of minority carriers from the P-type well layer 103 into the N-type drift layer 102 produces a large conductance modulation effect and reduces the resistance of the semiconductor device.

Therefore, as described above, as resistance of the path from the source electrode 111 to the body diode interface 106 decreases, or as the body diode interface connected from the source electrode 111 through low resistance (hereinafter, referred to as "low-resistance body diode interface") is farther away from the Schottky interface 115, resistance of the bipolar current path becomes lower than resistance of the unipolar current path passing through the proximity of the low-resistance body diode interface. Accordingly, the bipolar current density increases relatively, and I2t tolerance improves.

For example, the resistance of the path from the source electrode 111 to the body diode interface 106 can be reduced sufficiently if the impurity concentration at a concentration peak in the P-type low-resistance layer 107 is 10 times or more, or desirably 100 times or more, the impurity concentration in the outermost layer (i.e., channel region 104) of the P-type well layer 103 that is sandwiched between the N-type drift layer 102 and the N-type source layer 105.

In the present embodiment, since the P-type low-resistance layer 107 is formed not only on one side face of the N-type source layer 105 but also on or below the lower face of the N-type source layer 107 as illustrated in the example in FIG. 2, the low-resistance body diode interface can be located at a position away from the Schottky interface 115. Accordingly, it is possible to improve I2t tolerance.

Figure 3:
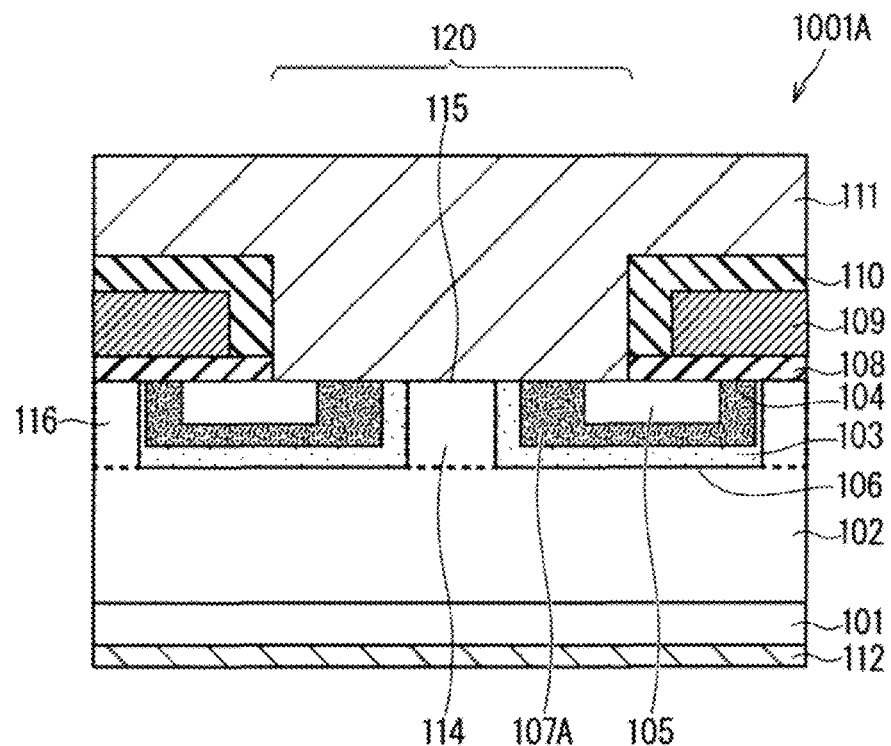
FIG. 3 is a sectional view schematically illustrating another configuration example of an active cell in a semiconductor device 1001A according to the embodiment.

FIG. 3 is a sectional view schematically illustrating another configuration example of an active cell in a semiconductor device 1001A according to the present embodiment.

As illustrated in the example in FIG. 3, the active cell in the semiconductor device 1001A includes an N-type semiconductor substrate 101, an N-type drift layer 102, a P-type well layer 103, an N-type source layer 105, a P-type low-resistance layer 107A formed in part of the outermost layer of the P-type well layer 103, a gate insulating film 108, a gate electrode 109, an interlayer insulation film 110, a source electrode 111, and a drain electrode 12, the source electrode 111 being formed to cover the interlayer insulation film 110, the upper face of the N-type source layer 105 that is not covered with the gate insulating film 108, the upper face of the P-type low-resistance layer 107A that is not covered with the gate insulating film 108, the upper face of the P-type well layer 103 that is not covered with the gate insulating film 108, and the upper face of the N-type drift layer 102 that is not covered with the gate insulating film 108.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107A, the upper face of the P-type well layer 103, and the upper face of the N-type drift layer 102 corresponds to a source contact hole 120.

The P-type low-resistance layer 107A is separated from the Schottky region 114 in the direction of a plane (i.e., right-left direction in FIG. 3) by the P-type well layer 103. The P-type low-resistance layer 107A exists not only on both lateral sides of the N-type source layer 105 but also on the underside of the N-type source layer 105 as viewed in section illustrated in FIG. 3. The lower face of the P-type low-resistance layer 107A is located below the Schottky interface 115.

The source electrode 111 has Schottky contact with the Schottky region 114. The drain electrode 112 has ohmic contact with the lower face of the N-type semiconductor substrate 101.

Figure 4:
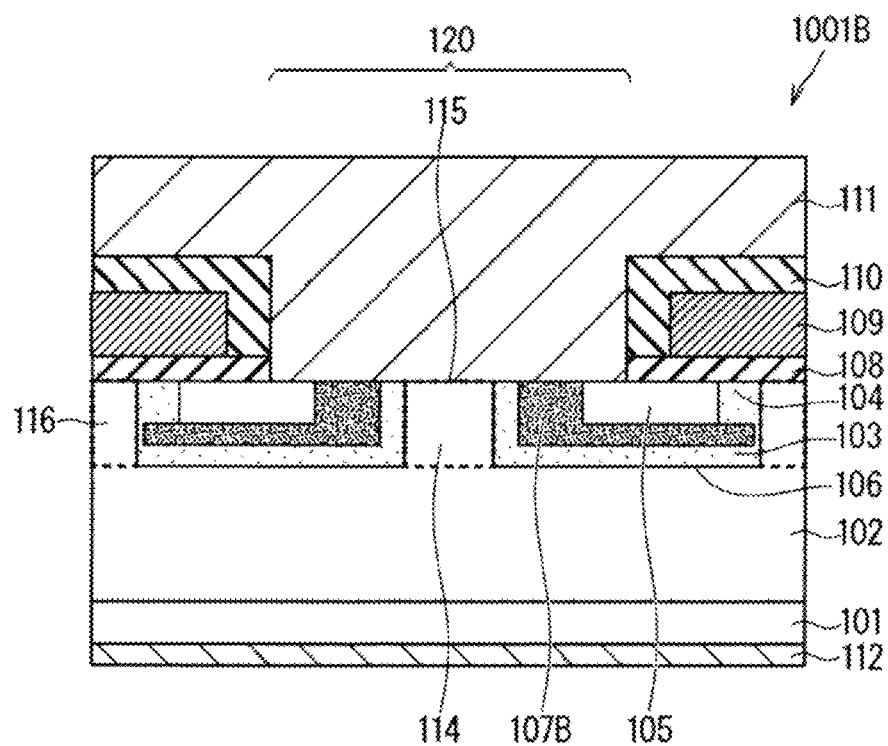
FIG. 4 is a sectional view schematically illustrating another configuration example of an active cell in a semiconductor device 1001B according to the embodiment.

FIG. 4 is a sectional view schematically illustrating another configuration example of an active cell in a semiconductor device 1001B according to the present embodiment.

As illustrated in the example in FIG. 4, the active cell in the semiconductor device 1001B includes an N-type semiconductor substrate 101, an N-type drift layer 102, a P-type well layer 103, an N-type source layer 105, a P-type low-resistance layer 107B formed in part of the outermost layer of the P-type well layer 103, a gate insulating film 108, a gate electrode 109, an interlayer insulation film 110, a source electrode 111, and a drain electrode 112, the source electrode 111 being formed to cover the interlayer insulation film 110, the upper face of the N-type source layer 105 that is not covered with the gate insulating film 108, the upper face of the P-type low-resistance layer 107B that is not covered with the gate insulating film 108, the upper face of the P-type well layer 103 that is not covered with the gate insulating film 108, and the upper face of the N-type drift layer 102 that is not covered with the gate insulating film 108.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107B, the upper face of the P-type well layer 103, and the upper face of the N-type drift layer 102 corresponds to a source contact hole 120.

The P-type low-resistance layer 107B is separated from the Schottky region 114 in the direction of a plane (i.e., right-left direction in FIG. 4) by the P-type well layer 103. The P-type low-resistance layer 107B exists not only on one lateral side of the N-type source layer 105 (the lateral side closer to the Schottky interface 115) but also on the underside of the N-type source layer 105 as viewed in section illustrated in FIG. 4. The P-type low-resistance layer 107B is further formed extending to below the channel region 104 (i.e., to the interior of the P-type well layer 103 in the direction away from the Schottky interface 115) to the same depth as the portion thereof formed on the underside of the N-type source layer 105. The lower face of the P-type low-resistance layer 107B is located below the Schottky interface 115.

The source electrode 111 has Schottky contact with the Schottky region 114. The drain electrode 112 has ohmic contact with the lower face of the N-type semiconductor substrate 101.

As illustrated in the example in FIG. 3 or 4, if the low-resistance body diode interface is formed by forming the P-type low-resistance layer 107A or 107B below the channel region 104, which is located at a position far from the Schottky interface 115, the low-resistance body diode interface can be formed at a position away from the Schottky interface 115. Accordingly, I2t tolerance improves.

However, when the P-type low-resistance layer 107A is formed extending up to the channel region 104 as illustrated in the example in FIG. 3, the threshold value for gate-source voltage is more increased than in the case the P-type low-resistance layer does not extend up to the channel region 104. Thus, the threshold value may be adjusted as necessary by, for example, additional N-ion implantation.

Alternatively, a region below the N-type source layer 105 may include a region where the P-type low-resistance layer exists and a region where the P-type low-resistance layer does not exist, for example, in the depth direction of the plane of the drawing. That is, the P-type low-resistance layer may be partly (i.e., intermittently) formed below the N-type source layer 105.

Figure 5:
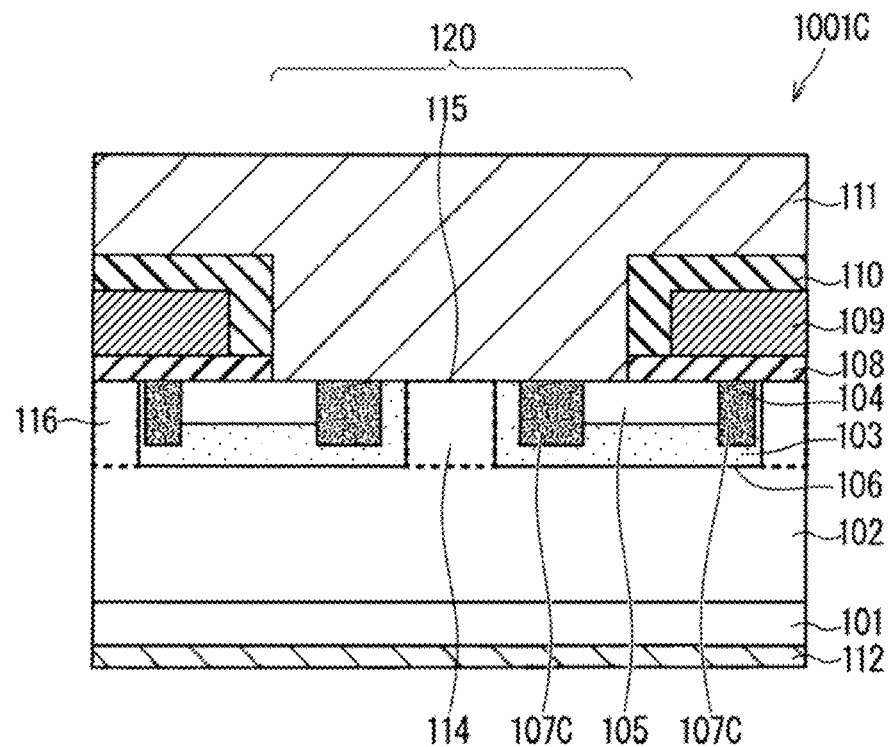
FIG. 5 is a sectional view schematically illustrating another configuration example of an active cell in a semiconductor device 1001C according to the embodiment.

FIG. 5 is a sectional view schematically illustrating another configuration example of an active cell in a semiconductor device 1001C according to the present embodiment.

As illustrated in the example in FIG. 5, the active cell in the semiconductor device 1001C includes an N-type semiconductor substrate 101, an N-type drift layer 102, a P-type well layer 103, an N-type source layer 105, a P-type low-resistance layer 107C formed in part of the outermost layer of the P-type well layer 103, a gate insulating film 108, a gate electrode 109, an interlayer insulation film 110, a source electrode 111, and a drain electrode 112, the source electrode 111 being formed to cover the interlayer insulation film 110, the upper face of the N-type source layer 105 that is not covered with the gate insulating film 108, the upper face of the P-type low-resistance layer 107C that is not covered with the gate insulating film 108, the upper face of the P-type well layer 103 that is not covered with the gate insulating film 108, and the upper face of the N-type drift layer 102 that is not covered with the gate insulating film 108.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107C, the upper face of the P-type well layer 103, and the upper face of the N-type drift layer 102 corresponds to a source contact hole 120.

The P-type low-resistance layer 107C is separated from the Schottky region 114 in the direction of a plane (i.e., right-left direction in FIG. 5) by the P-type well layer 103. The P-type low-resistance layer 107C exists on both lateral sides of the N-type source layer 105 as viewed in section illustrated in FIG. 5. Note that the P-type low-resistance layer 107C is not formed on the underside of the N-type source layer 105 and is formed while making its way around the N-type source layer 105 from the depth direction of the plane of the drawing in FIG. 5.

Here, the P-type low-resistance layer 107C does not necessarily have to exist laterally of the N-type source layer 105 on the side close to the Schottky interface 115 and on the depth side of the plane of the drawing. The P-type low-resistance layer 107C may be formed on the side farther from the Schottky interface 115 and may be connected at any point to the source electrode 111.

The lower face of the P-type low-resistance layer 107C is located below the Schottky interface 115.

The source electrode 111 has Schottky contact with the Schottky region 114. The drain electrode 112 has ohmic contact with the lower face of the N-type semiconductor substrate 101.

Figure 6:
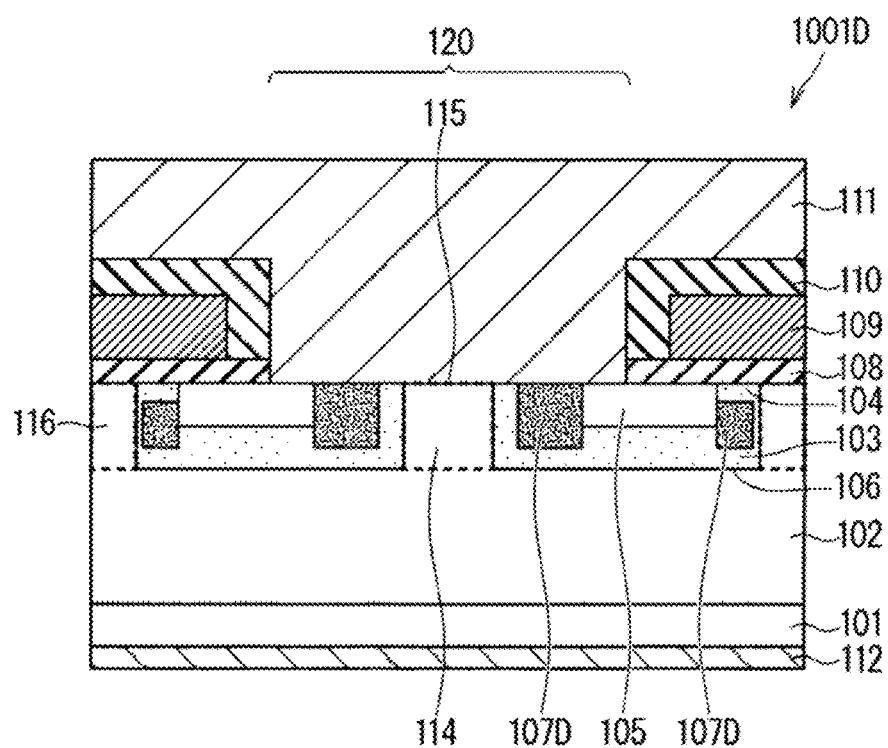
FIG. 6 is a sectional view schematically illustrating another configuration example of an active cell in a semiconductor device 1001D according to the embodiment.

FIG. 6 is a sectional view schematically illustrating another configuration example of an active cell in a semiconductor device 1001D according to the present embodiment.

As illustrated in the example in FIG. 6, the active cell in the semiconductor device 1001D includes an N-type semiconductor substrate 101, an N-type drift layer 102, a P-type well layer 103, an N-type source layer 105, a P-type low-resistance layer 107D formed in part of the outermost layer of the P-type well layer 103, a gate insulating film 108, a gate electrode 109, an interlayer insulation film 110, a source electrode 111, and a drain electrode 112, the source electrode 111 being formed to cover the interlayer insulation film 110, the upper face of the N-type source layer 105 that is not covered with the gate insulating film 108, the upper face of the P-type low-resistance layer 107D that is not covered with the gate insulating film 108, the upper face of the P-type well layer 103 that is not covered with the gate insulating film 108, and the upper face of the N-type drift layer 102 that is not covered with the gate insulating film 108.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107D, the upper face of the P-type well layer 103, and the upper face of the N-type drift layer 102 corresponds to a source contact hole 120.

The P-type low-resistance layer 107D is separated from the Schottky region 114 in the direction of a plane (i.e., right-left direction in FIG. 6) by the P-type well layer 103. The P-type low-resistance layer 107D exists on both lateral sides of the N-type source layer 105 as viewed in section illustrated in FIG. 6. The P-type low-resistance layer 107D is not formed in proximity to the upper face of the P-type well layer 103 immediately under the gate insulating film 108 serving as a channel region 104, and is formed at a position deeper than a predetermined depth. Note that the P-type low-resistance layer 107D is not formed on the underside of the N-type source layer 105 and is formed while making its way around the N-type source layer 105 from the depth direction of the plane of the drawing in FIG. 6.

Here, the P-type low-resistance layer 107D does not necessarily have to exist laterally of the N-type source layer 105 on the side close to the Schottky interface 115 and on the depth side of the plane of the drawing. The P-type low-resistance layer 107D may exist on the side farther from the Schottky interface 115 and may be connected at any point to the source electrode 111.

The lower face of the P-type low-resistance layer 107D is located below the Schottky interface 115.

The source electrode 111 has Schottky contact with the Schottky region 114. The drain electrode 112 has ohmic contact with the lower face of the N-type semiconductor substrate 101.

When the P-type low-resistance layer is formed below the channel region 104, the P-type low-resistance layer does not necessary have to be formed as well below the N-type source layer 105. For example, as illustrated in the example in FIG. 5 or 6, the P-type low-resistance layer 107C or 107D may be connected to the N-type source layer 105 from the depth direction of the plane of the drawing. Even with such a configuration, it is possible to improve I2t tolerance.

As the distance between the lower face of the P-type well layer 103 and the lower face of the P-type low-resistance layer 107 (which may be replaced by the P-type low-resistance layer 107A, the P-type low-resistance layer 107B, the P-type low-resistance layer 107C, or the P-type low-resistance layer 107D) decreases, the resistance value between the source electrode 111 and the low-resistance body diode interface decreases. Accordingly, I2t tolerance improves.

Therefore, it is preferable that the lower face of the P-type low-resistance layer 107 (which may be replaced by the P-type low-resistance layer 107A, the P-type low-resistance layer 107B, the P-type low-resistance layer 107C, or the P-type low-resistance layer 107D) is located at a position deeper than the lower face of the N-type source layer 105. In other words, the depth of at least one of concentration peaks in the depth direction of the P-type low-resistance layer 107 (which may be replaced by the P-type low-resistance layer 107A, the P-type low-resistance layer 107B, the P-type low-resistance layer 107C, or the P-type low-resistance layer 107D) is preferably greater than the depth of every concentration peak in the N-type source layer 105.

During normal operation of the MOSFET including SBDs, it is preferable that the return current does not operate the body diode and flows only through the Schottky interface in order to prevent bipolar deterioration. Maximum current density that enables current flow while satisfying this condition is hereinafter referred to as maximum unipolar current density. Also, high maximum unipolar current density is expressed as a high unipolar current-carrying capability.

The maximum unipolar current density is determined by the resistance value between the Schottky interface 115 and the body diode interface that is connected from the Schottky interface 115 through highest resistance via the N-type drift layer 102.

This is because the voltage applied to the body diode interface 106 is determined by a voltage drop caused by the flow of unipolar current from the Schottky interface 115 to the body diode interface 106, and bipolar current is most easily applied to the body diode interface connected from the Schottky interface 115 through highest resistance.

The P-type low-resistance layer formed in the present embodiment does not affect the resistance value of the path from the Schottky interface 115 to the body diode interface connected through highest resistance. Therefore, the semiconductor device has maximum unipolar current density equivalent to the maximum unipolar current density of a semiconductor device that does not include the P-type low-resistance layer. That is, it is possible to maintain the maximum unipolar current density while improving I2t tolerance.

As described above, the semiconductor device 1001D makes it possible to maintain the maximum unipolar current density while improving I2t tolerance.

Method of Manufacturing Semiconductor Device

Next, a method of manufacturing the semiconductor device 1001 according to the present embodiment will be described.

First, the N-type semiconductor substrate 101 and the N-type drift layer 102 formed by epitaxial crystal growth on the upper face of the N-type semiconductor substrate 101 are prepared.

The N-type drift layer 102 has a lower N-type impurity concentration than that of the N-type semiconductor substrate 101. The N-type impurity concentration and thickness of the N-type drift layer 102 are each set depending on the design withstand voltage of the semiconductor device 1001.

Specifically, the N-type impurity concentration of the N-type drift layer 102 may be set to, for example, $1.0 \times 10^{14}/\text{cm}^3$ or more and $1.0 \times 10^{16}/\text{cm}^3$ or less. The thickness of the N-type drift layer 102 may be set to, for example, 1 μm or more and 200 μm or less.

Next, impurities (i.e., dopant) are ion implanted using an implantation mask (e.g., a photoresist or a silicon oxide film) patterned by photomechanical processing. Accordingly, the P-type well layer 103, the P-type low-resistance layer 107, and the N-type source layer 105 are formed.

The impurity concentration and thickness of each layer may be set, for example, as follows. Specifically, the impurity concentration of the P-type well layer 103 is assumed to exceed the impurity concentration of the N-type drift layer 102, and a maximum impurity concentration of the P-type well layer 103 may be set to, for example, $1.0 \times 10^{15}/\text{cm}^3$ or more and $1.0 \times 10^{19}/\text{cm}^3$ or less. The thickness of the P-type well layer 103 may be set to, for example, 0.1 μm or more and 2 μm or less.

The impurity concentration of the P-type low-resistance layer 107 is assumed to exceed the impurity concentration of the P-type well layer 103, and a maximum impurity concentration of the P-type low-resistance layer 107 may be set to, for example, $1.0 \times 10^{18}/\text{cm}^3$ or more and $1.0 \times 10^{21}/\text{cm}^3$ or less. The thickness of the P-type low-resistance layer 107 may be set to, for example, 0.1 μm or more and 2 μm or less.

The impurity concentration of the N-type source layer 105 is assumed to exceed the impurity concentration of the P-type well layer 103, and a maximum impurity concentration of the N-type source layer 105 may be set to, for example, $1.0 \times 10^{16}/\text{cm}^3$ or more and $1.0 \times 10^{20}/\text{cm}^3$ or less. The thickness of the N-type source layer 105 is smaller than the thickness of the P-type well layer 103 and the thickness of the P-type low-resistance layer 107 and may be set to, for example, 0.05 μm or more and 1 μm or less.

Thereafter, heat treatment is performed in order to electrically activate the impurities implanted in the N-type drift layer 102.

Next, the gate insulating film 108 is formed by, for example, thermal oxidation or deposition. Thereafter, processing may be performed in order to improve the characteristics of the gate insulating film 108 and the characteristics of the interface between the gate insulating film 108 and the P-type well layer 103, at which a channel is formed. Examples of this processing for improving the characteristics include high-temperature heat treatment, nitriding, and oxidation.

Then, the gate electrode 109 is formed of polysilicon or other materials on the upper face of the gate insulating film 108, and patterning is further performed by photomechanical processing and etching.

Next, the interlayer insulation film 110 is formed on the upper face of the N-type drift layer 102 by, for example, chemical vapor deposition (i.e., CVD).

Then, for example, the interlayer insulation film 110 and the gate insulating film 108 are selectively removed by dry etching so as to form the source contact hole 120 for connecting the source electrode 111 to the P-type well layer 103, the N-type source layer 105, the P-type low-resistance layer 107, and the Schottky region 114.

Then, the source electrode 111 is formed on the upper face of the N-type drift layer 102. The source electrode 111 has ohmic contact with the N-type source layer 105 and the P-type low-resistance layer 107 and has Schottky contact with the Schottky region 114.

Note that the Schottky region 114 is of the same conductivity type as the N-type drift layer 102 and may have the same impurity concentration as the N-type drift layer 102, or may be set to have a higher impurity concentration than that of the N-type drift layer 102 by, for example, ion implantation in order to reduce resistance.

The JFET region 116, which is a region sandwiched between two P-type well layers 103 located below the gate insulating film 108, is of the same conductivity type as the N-type drift layer 102. The JFET region 116 may have the same impurity concentration as the N-type drift layer 102, or may be set to have a higher impurity concentration than that of the N-type drift layer 102 by, for example, ion implantation in order to reduce resistance.

Moreover, the drain electrode 112 having ohmic contact with the lower face of the N-type semiconductor substrate 101 is formed.

Through the above-described steps, the configuration of the active cell in the semiconductor device 1001 according to the present embodiment is completed.

Second Embodiment

Semiconductor devices according to the present embodiment will be described. In the following description, constituent elements that are similar to those described in the above embodiment are given the same reference signs in the illustration, and a detailed description thereof shall be appropriately omitted.

Configuration of Semiconductor Device

Figure 7:
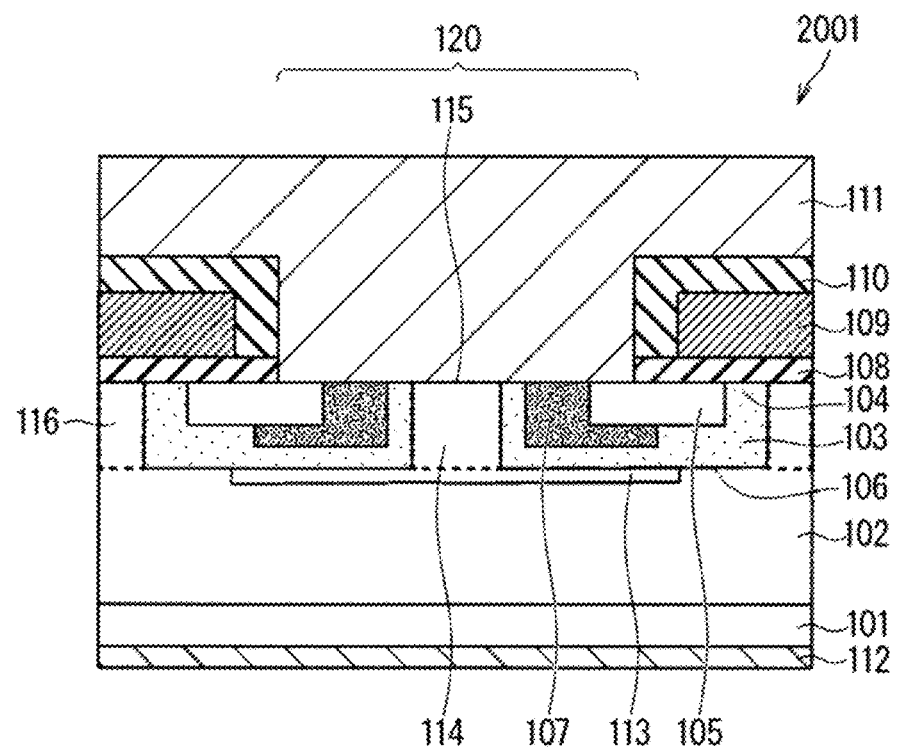
FIG. 7 is a sectional view schematically illustrating a configuration example of an active cell in a semiconductor device 2001 according to another embodiment.

FIG. 7 is a sectional view schematically illustrating a configuration example of an active cell in a semiconductor device 2001 according to the present embodiment.

As illustrated in the example in FIG. 7, the active cell in the semiconductor device 2001 includes an N-type semiconductor substrate 101, an N-type drift layer 102, a P-type well layer 103, an N-type source layer 105, a P-type low-resistance layer 107, a gate insulating film 108, a gate electrode 109, an interlayer insulation film 110, a source electrode 111, a drain electrode 112, and an N-type low-resistance layer 113 formed from the upper face of the N-type drift layer 102 to below the P-type well layer 103.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107, the upper face of the P-type well layer 103, and the upper face of the N-type drift layer 102 corresponds to a source contact hole 120.

The N-type low-resistance layer 113 is formed on part of the lower face of the P-type well layer 103 and below and across the Schottky region 114. That is, the N-type low-resistance layer 113 is formed at least in a position overlapping the Schottky interface 115 and the P-type low-resistance layer 107 in plan view.

The N-type low-resistance layer 113 has a higher impurity concentration than that of the N-type drift layer 102.

The source electrode 111 has Schottky contact with the Schottky region 114. The drain electrode 112 has ohmic contact with the lower face of the N-type semiconductor substrate 101.

Figure 8:
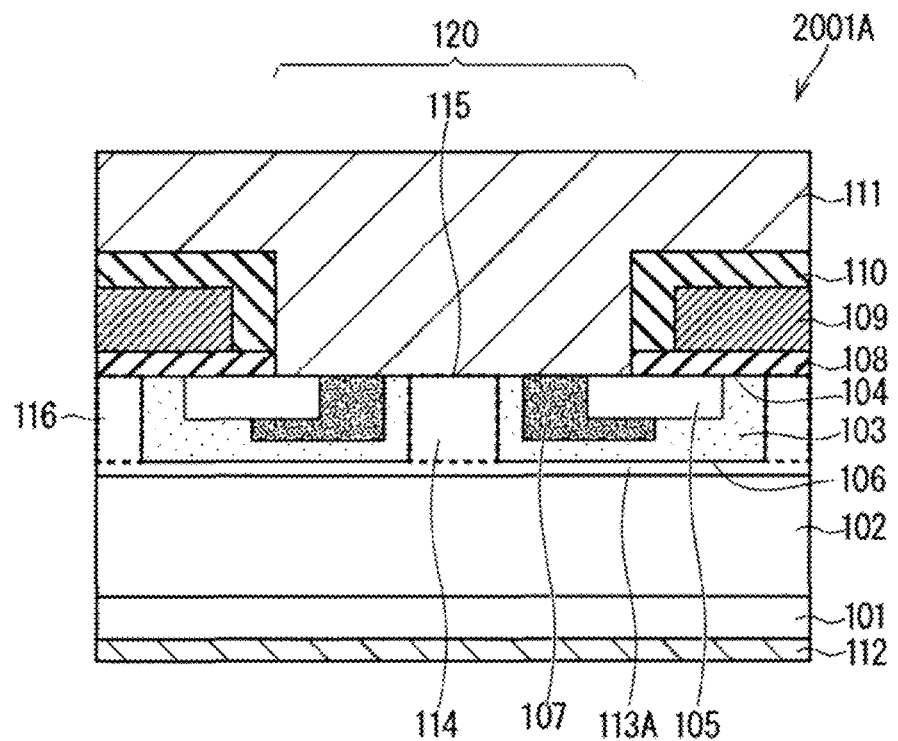
FIG. 8 is a sectional view schematically illustrating another configuration example of an active cell in a semiconductor device 2001A according to the embodiment.

FIG. 8 is a sectional view schematically illustrating another configuration example of an active cell in a semiconductor device 2001A according to the present embodiment.

As illustrated in the example in FIG. 8, the active cell in the semiconductor device 2001A includes an N-type semiconductor substrate 101, an N-type drift layer 102, a P-type well layer 103, an N-type source layer 105, a P-type low-resistance layer 107, a gate insulating film 108, a gate electrode 109, an interlayer insulation film 110, a source electrode 111, a drain electrode 112, and an N-type low-resistance layer 113A formed from the upper face of the N-type drift layer 102 to below the P-type well layer 103.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111 is in contact with the upper face of the N-type source layer 105, the upper face of the P-type low-resistance layer 107, the upper face of the P-type well layer 103, and the upper face of the N-type drift layer 102 corresponds to a source contact hole 120.

The N-type low-resistance layer 113A is formed on the lower face of the P-type well layer 103, below the Schottky region 114, and below the JFET region 116 across the entire surface of the active cell.

The source electrode 111 has Schottky contact with the Schottky region 114. The drain electrode 112 has ohmic contact with the lower face of the N-type semiconductor substrate 101.

The operation of the semiconductor device 2001 according to the present embodiment and the operation of the semiconductor device 2001A according to the present embodiment are similar to the operation of the semiconductor device 1001 described in the first embodiment.

Functions and effects of the semiconductor devices according to the present embodiment will be described hereinafter.

During normal operation of the semiconductor devices, the presence of the N-type low-resistance layer 113 reduces the resistance value of the path from the Schottky interface 115 to the body diode interface connected through highest resistance. Accordingly, the maximum unipolar current density increases.

On the other hand, when a large return current flows through the semiconductor device 2001, a large number of minority carriers are injected from the P-type well layer 103 to the N-type drift layer 102. This injection reduces the influence of the presence of the N-type low-resistance layer 113 on the resistance value of the path from the Schottky interface 115 to the body diode interface connected through highest resistance. Accordingly, the influence of the N-type low-resistance layer 113 on I2t tolerance is small.

In order to further reduce the influence of the presence of the N-type low-resistance layer 113 on I2t tolerance, it is preferable that the N-type low-resistance layer 113 has a smaller impurity concentration than that of the P-type well layer 103.

As described above, the semiconductor device 2001 makes it possible to improve maximum unipolar current density without almost decreasing I2t tolerance. Accordingly, it is possible to improves the tradeoff relation between I2t tolerance and maximum unipolar current density.

Method of Manufacturing Semiconductor Device

Next, a method of manufacturing the semiconductor device 2001 according to the present embodiment will be described.

In the method of manufacturing the semiconductor device 1001 according to the first embodiment, the N-type low-resistance layer 113 is also formed with the P-type well layer 103, the P-type low-resistance layer 107, and the N-type source layer 105.

Ion implantation for forming the N-type low-resistance layer 113 may be performed on the entire surface or may be performed through patterning using an implantation mask.

The other steps in the manufacturing method are similar to those in the method of manufacturing the semiconductor device 1001 described in the first embodiment.

Third Embodiment

A semiconductor device according to the present embodiment will be described. In the following description, constituent elements that are similar to those described in the above embodiment are given the same reference signs in the illustration, and a detailed description thereof shall be appropriately omitted.

Configuration of Semiconductor Device

Figure 9:
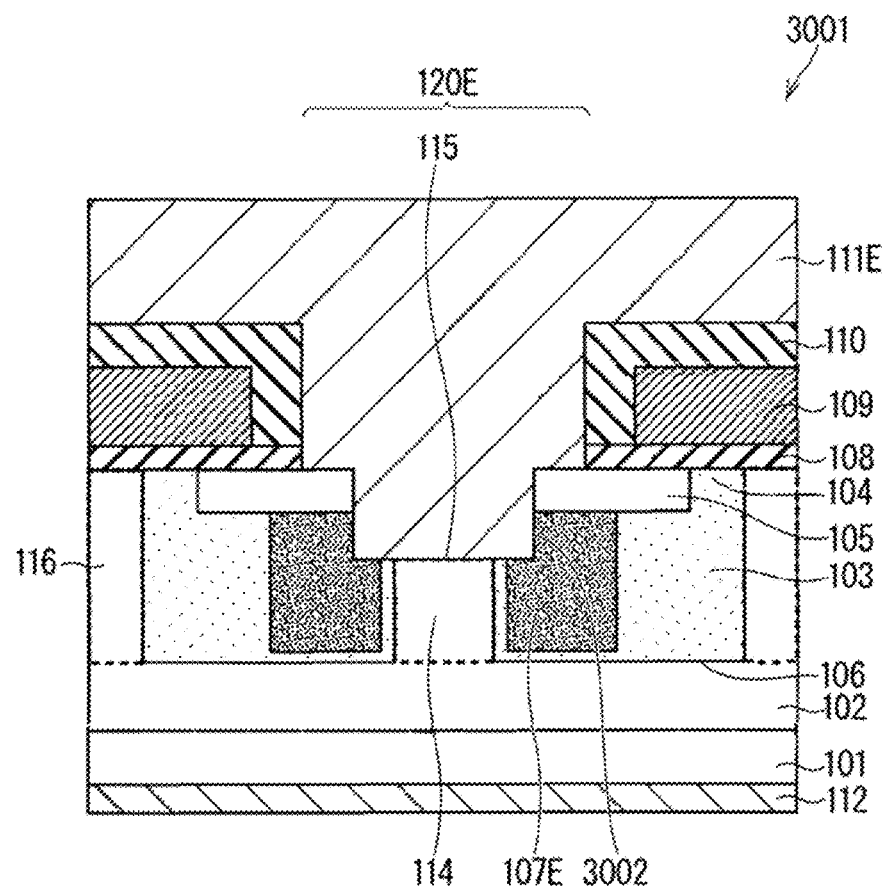
FIG. 9 is a sectional view schematically illustrating a configuration example of an active cell in a semiconductor device 3001 according to another embodiment.

FIG. 9 is a sectional view schematically illustrating a configuration example of an active cell in a semiconductor device 3001 according to the present embodiment.

As illustrated in the example in FIG. 9, the active cell in the semiconductor device 3001 includes an N-type semiconductor substrate 101, an N-type drift layer 102, a P-type well layer 103, an N-type source layer 105, a P-type low-resistance layer 107E formed in the P-type well layer 103, a gate insulating film 108, a gate electrode 109, an interlayer insulation film 110, a source electrode 111E, and a drain electrode 112, the source electrode 111E being formed to cover the interlayer insulation film 110, the upper and side faces of the N-type source layer 105 that are not covered with the gate insulating film 108, the upper and side faces of the P-type low-resistance layer 107E that are not covered with the gate insulating film 108, the upper face of the P-type well layer 103 that is not covered with the gate insulating film 108, and the upper face of the N-type drift layer 102 that is not covered with the gate insulating film 108.

Here, a region located in proximity to the upper face of the P-type well layer 103 that is sandwiched between the N-type source layer 105 and the N-type drift layer 102 corresponds to a channel region 104. The boundary between the lower face of the P-type well layer 103 and the N-type drift layer 102 corresponds to a body diode interface 106

A region located in proximity to the upper face of the N-type drift layer 102 that is in contact with the source electrode 111E corresponds to a Schottky region 114. The upper face of the N-type drift layer 102 that is in contact with the source electrode 111E corresponds to a Schottky interface 115.

A region located in proximity to the upper face of the N-type drift layer 102 that is in contact with the gate insulating film 108 corresponds to a JFET region 116. A region that is formed between gate electrodes 109 and in which the source electrode 111E is in contact with the upper and side faces of the N-type source layer 105, the upper and side faces of the P-type low-resistance layer 107E, the upper face of the P-type well layer 103, and the upper face of the N-type drift layer 102 corresponds to a source contact hole 120E.

The source contact hole 120E has a trench 3002 in a position that is in contact with the N-type source layer 105, the P-type low-resistance layer 107E, and the Schottky region 114 (i.e., in the upper face of the N-type drift layer 102).

The trench 3002 has a side wall in which part of the P-type low-resistance layer 107E and the N-type source layer 105 are located. Then, each of the part of the P-type low-resistance layer 107E and the N-type source layer 105 comes in contact with the source electrode 111E.

The trench 3002 has a bottom in which part of the P-type low-resistance layer 107E, part of the N-type drift layer 102, and the Schottky region 114 are located. Then, each of the part of the P-type low-resistance layer 107E, the part of the N-type drift layer 102, and the Schottky region 114 comes in contact with the source electrode 111E.

In the case where the space between the gate electrodes 109 is narrow and accordingly the trench 3002 is formed with a small width, only the side face of the N-type source layer 105 that is not covered with the gate insulating film 108 may be in contact with the side wall of the trench 3002, and the upper and side faces of the P-type low-resistance layer 107E may be in contact with the trench 3002.

Both of the low-resistance layer 107E and the source layer 105 may be connected at any point to the source electrode 111E.

The P-type low-resistance layer 107E is located below the N-type source layer 105. The lower face of the P-type low-resistance layer 107E is located below the Schottky interface 115.

The P-type low-resistance layer 107E is also separated from the Schottky region 114 in the direction of a plane (i.e., right-left direction in FIG. 9) by the P-type well layer 103.

The source electrode 111E has Schottky contact with the Schottky region 114. The drain electrode 112 has ohmic contact with the lower face of the N-type semiconductor substrate 101.

The operation of the semiconductor device 3001 according to the present embodiment is similar to the operation of the semiconductor device 1001 described in the first embodiment.

Functions and effects of the semiconductor device 3001 will be described hereinafter.

The side wall of the trench 3002 in the source contact hole 120E is connected to the N-type source layer 105 and the P-type low-resistance layer 107E. Accordingly, even if the source contact hole 120E is reduced in width, the source electrode 111E can be reliably connected to the N-type source layer 105 and the P-type low-resistance layer 107E. Thus, it is possible to reduce the pitch of unit cells.

When a voltage is applied between the source electrode 111E and the drain electrode 112 in the off state of the semiconductor device 3001, an electric field concentrates mainly on the Schottky interface 115 and the gate insulating film 108 that is located above the JFET region 116. By changing the depth of the trench 3002 or the depth of the Schottky region 114, it becomes easy to individually design the withstand voltage of each of the Schottky interface 115 and the gate insulating film 108 located above the JFET region 116.

For example, the resistance of the semiconductor device 3001 in the on state (hereinafter, referred to as an on-state resistance) decreases as the impurity concentration of the JFET region 116 increases, as the depth of the JFET region 116 decreases, and as the width of the JFET region 116 increases. This, however, increases the electric field in the gate insulating film 108 located above the JFET region 116.

On the other hand, the maximum unipolar current density increases as the impurity concentration of the Schottky region 114 increases, as the depth of the Schottky region 114 decreases, and as the width of the Schottky region 114 increases. This, however, increases the electric field in the Schottky interface 115.

In order to moderate the electric field concentration on the Schottky interface 115, the Schottky region 114 needs to have a fixed depth, but in this case, the distance from the source electrode 111E to the body diode interface 106 increases and accordingly resistance increases. If the lower face of the P-type low-resistance layer 107E is brought close enough to the lower face of the P-type well layer 103, which is located below the bottom of the trench 3002, it is possible to prevent an increase in the resistance of the path from the source electrode 111E to the body diode interface 106 and to maintain I2t tolerance.

Figure 10:
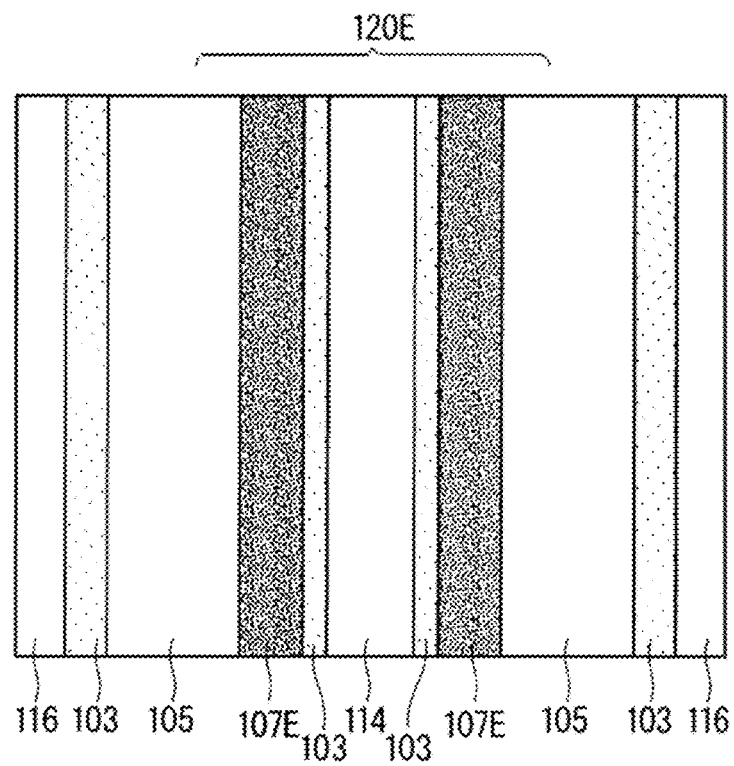
FIG. 10 is a plan view schematically illustrating the configuration example of the active cell in the semiconductor device described in the embodiment.

FIG. 10 is a plan view schematically illustrating a configuration example of an active cell in the semiconductor device described in the present embodiment. Note that the semiconductor devices described in the first and second embodiments may also have a similar plane layout.

As illustrated in the example in FIG. 10, the active cell has a comb shape in plan form, i.e., the Schottky interface 115 on the upper face of the Schottky region 114 is formed extending in the up-down direction in FIG. 10 in plan view, and the P-type low-resistance layer 107E is also formed extending in the up-down direction in FIG. 10 in plan view. Accordingly, the area of the equivalent body diode interface 106 located farthest from the Schottky interface 115 is more increased than in the case where the active cell has a grid-like shape in plan form. Therefore, I2t tolerance can be increased effectively by including the P-type low-resistance layer 107E.

To simplify the drawing, only the N-type drift layer 102, the P-type well layer 103, the N-type source layer 105, and the P-type low-resistance layer 107E are illustrated in FIG. 10.

Method of Manufacturing Semiconductor Device

Next, a method of manufacturing the semiconductor device 3001 according to the present embodiment will be described.

The method of manufacturing the semiconductor device 3001 until the source contact hole 120E is formed is similar to the method of manufacturing the semiconductor device 1001 described in the first embodiment.

Then, the trench 3002 is formed by photomechanical processing and etching, and the source electrode 111E is formed on the upper face of the N-type drift layer 102.

The source electrode 111E is connected to the N-type source layer 105 and the P-type low-resistance layer 107E by ohmic contact. The source electrode 111E is also connected to the Schottky region 114 by Schottky contact.

Moreover, the drain electrode 112 is formed to have ohmic contact with the lower face of the N-type semiconductor substrate 101.

Through the above-described steps, the active cell in the semiconductor device 3001 according to the present embodiment is completed.

Fourth Embodiment

A semiconductor device according to the present embodiment will be described. In the following description, constituent elements that are similar to those described in the above embodiment are given the same reference signs in the illustration, and a detailed description thereof shall be appropriately omitted.

Configuration of Semiconductor Device

Figure 11:
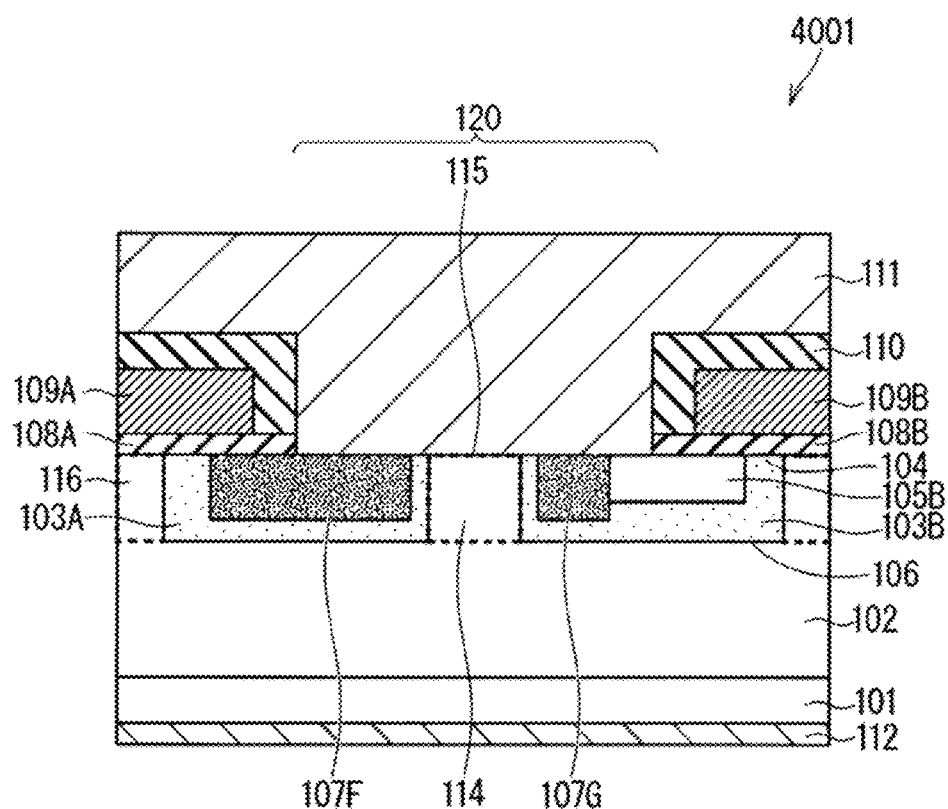
FIG. 11 is a sectional view schematically illustrating a configuration example of an active cell in a semiconductor device 4001 according to another embodiment.

FIG. 11 is a sectional view schematically illustrating a configuration example of an active cell in a semiconductor device 4001 according to the present embodiment.

As illustrated in the example in FIG. 11, the active cell in the semiconductor device 4001 includes an N-type semiconductor substrate 101, an N-type drift layer 102, a P-type well layer 103A formed in part of the outermost layer of the N-type drift layer 102, a P-type well layer 103B formed in part of the outermost layer of the N-type drift layer 102, an N-type source layer 105B formed in part of the outermost layer of the P-type well layer 103B and having a higher impurity concentration than that of the N-type drift layer 102, a P-type low-resistance layer 107F formed in the outermost layer of the P-type well layer 103A and having a higher impurity concentration than that of the P-type well layer 103A, a P-type low-resistance layer 107G formed in the outermost layer of the P-type well layer 103B and having a higher impurity concentration than that of the P-type well layer 103B, a gate insulating film 108A formed at least in contact with the upper face of the P-type well layer 103A that is sandwiched between the P-type low-resistance layer 107F and the N-type drift layer 102, a gate electrode 109A formed on the upper face of the gate insulating film 108A, a gate insulating film 108B formed at least in contact with the upper face of the P-type well layer 103B that is sandwiched between the N-type source layer 105B and the N-type drift layer 102, a gate electrode 109B formed on the upper face of the gate insulating film 108B, an interlayer insulation film 110 formed to cover the gate electrode 109A and the gate electrode 109B, a source electrode 111, and a drain electrode 112, the source electrode 111 being formed to cover the interlayer insulation film 110, the upper face of the N-type source layer 105B that is not covered with the gate insulating film 108B, the upper face of the P-type low-resistance layer 107F that is not covered with the gate insulating film 108A, the upper face of the P-type low-resistance layer 107G that is not covered with the gate insulating film 108B, the upper face of the P-type well layer 103A that is not covered with the gate insulating film 108A, the upper face of the P-type well layer 103B that is not covered with the gate insulating film 108B, and the upper face of the N-type drift layer 102 that is not covered with the gate insulating film 108A and the gate insulating film 108B.

As described above, the semiconductor device 4001 according to the present embodiment does not include an N-type source layer in part of the P-type well layer.

Here, a region located in proximity to the upper face of the P-type well layer 103B that is sandwiched between the N-type source layer 105B and the N-type drift layer 102 corresponds to a channel region 104. The boundary between the lower face of the P-type well layer 103A and the N-type drift layer 102 and the boundary between the lower face of the P-type well layer 103B and the N-type drift layer 102 correspond to body diode interfaces 106.

A region located in proximity to the upper face of the N-type drift layer 102 that is in contact with the source electrode 111 corresponds to a Schottky region 114. The upper face of the N-type drift layer 102 that is in contact with the source electrode 111 corresponds to a Schottky interface 115.

A region located in proximity to the upper face of the N-type drift layer 102 that is in contact with the gate insulating film 108A corresponds to a JFET region 116. A region that is formed between the gate electrode 109A and the gate electrode 109B and in which the source electrode 111 is in contact with the upper face of the N-type source layer 105B, the upper face of the P-type low-resistance layer 107F, the upper face of the P-type low-resistance layer 107G, the upper face of the P-type well layer 103A, the upper face of the P-type well layer 103B, and the upper face of the N-type drift layer 102 corresponds to a source contact hole 120.

The source electrode 111 has Schottky contact with the Schottky region 114. The drain electrode 112 has ohmic contact with the lower face of the N-type semiconductor substrate 101.

A lateral edge portion of the P-type low-resistance layer 107F on the side farther from the Schottky interface 115 is located farther from the Schottky interface 115 than a lateral edge portion of the P-type low-resistance layer 107G on the side farther from the Schottky interface 115.

Note that the distance between a lateral edge portion of the P-type low-resistance layer 107F on the side close to the Schottky interface 115 and a lateral edge portion of the P-type well layer 103A on the side close to the Schottky interface 115 does not necessary have to be equal to the distance between a lateral edge portion of the P-type low-resistance layer 107G on the side close to the Schottky interface 115 and a lateral edge portion of the P-type well layer 103B on the side close to the Schottky interface 115.

The lower face of the P-type low-resistance layer 107F is located below the Schottky interface 115.

The P-type low-resistance layer 107G is formed laterally to the N-type source layer 105B. The lower face of the P-type low-resistance layer 107G is located below the Schottky interface 115.

The P-type low-resistance layer 107G is separated from the Schottky region 114 in the direction of a plane (i.e., right-left direction in FIG. 11) by the P-type well layer 103B.

The operation of the semiconductor device 4001 according to the present embodiment is similar to the operation of the semiconductor device 1001 described in the first embodiment.

Functions and effects of the semiconductor device 4001 according to the present embodiment will be described hereinafter.

According to the semiconductor device 4001 of the present embodiment, the presence of the P-type low-resistance layer 107F, which extends in the direction away from the Schottky interface 115, allows the low-resistance body diode interface to be formed at a position away from the Schottky interface 115. Accordingly, I2t tolerance improves.

Channel density decreases with increasing ratio of the number of P-type well layers 103A and the number of P-type low-resistance layers 107F to the number of P-type well layers 103B and the number of P-type low-resistance layers 107G. Therefore, the on-state resistance of the semiconductor device 4001 increases, but I2t tolerance improves.

As the withstand voltage of the semiconductor device increases, the impurity concentration of the N-type drift layer 102 decreases and the resistance of the N-type drift layer 102 relative to the resistance of the channel increases. Therefore, the rate of increase in on-state resistance caused by increasing the ratio of the P-type well layer 103A and the P-type low-resistance layer 107F becomes small.

Note that the P-type well layer 103A and the P-type low-resistance layer 107F are preferably arranged uniformly in cycles in a plane of the semiconductor device as viewed in plan view. In this case, minority carriers are injected uniformly in the plane of the semiconductor device 4001, and accordingly it is possible to suppress the in-plane distribution of resistivity. Accordingly, this is effective in suppressing current concentration.

Figure 12:
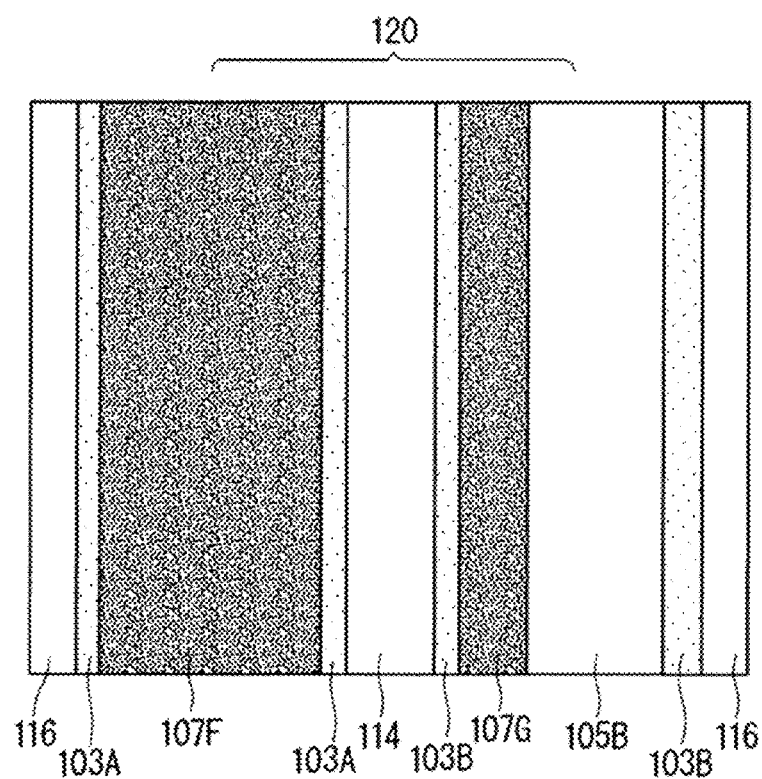
FIG. 12 is a plan view schematically illustrating the configuration example of the active cell in the semiconductor device described in the embodiment.

FIG. 12 is a plan view schematically illustrating a configuration example of an active cell in the semiconductor device described in the present embodiment. Note that the semiconductor devices described in the first, second, and third embodiments may also have a similar plane layout.

As illustrated in the example in FIG. 12, the active cell has a comb shape in plan form. Accordingly, the area of the equivalent body diode interface 106 located farthest from the Schottky interface 115 is more increased than in the case where the active cell has a grid-like shape in plan form. Therefore, I2t tolerance can be increased, including the P-type low-resistance layer 107F and the P-type low-resistance layer 107G.

To simplify the drawing, only the N-type drift layer 102, the P-type well layer 103A, the P-type well layer 103B, the N-type source layer 105B, the P-type low-resistance layer 107F, and the P-type low-resistance layer 107G are illustrated in FIG. 12.

Method of Manufacturing Semiconductor Device

Next, a method of manufacturing the semiconductor device 4001 according to the present embodiment will be described.

The method of manufacturing the semiconductor device 4001 is similar to the method of manufacturing the semiconductor device 1001 described in the first embodiment.

Note that ion implantation for forming an N-type source layer is not performed on the P-type well layer 103A, and ion implantation for forming the P-type low-resistance layer 107F is performed extending to a region farther away from the Schottky interface 115 than a region on which ion implantation for forming the P-type low-resistance layer 107G is performed.

Effects Produced by Above-Described Embodiments

Next, examples of the effects produced by the above-described embodiments will be described. In the following description, the effects are described based on the specific configurations given as examples in the above-described embodiments, but the configurations may be replaced by other specific configurations given as examples in the specification of the present invention within a range that can produce similar effects.

Such replacement may be made across a plurality of embodiments. That is, similar effects may be produced by a combination of configurations given as examples in different embodiments.

According to the above-described embodiments, the semiconductor device includes the semiconductor substrate 101 of the first conductivity type (N-type), the drain electrode 112, the N-type drift layer 102, the well layer 103 of the second conductivity type (P-type), the N-type source layer 105, the P-type first impurity layer, and the source electrode 11. The P-type first impurity layer corresponds to, for example, the P-type low-resistance layer 107. The drain electrode 112 has ohmic contact with the lower face of the N-type semiconductor substrate 101. The N-type drift layer 102 is formed on the upper face of the N-type semiconductor substrate 101. The P-type well layer 103 is formed in part of the outermost layer of the N-type drift layer 102. The N-type source layer 105 is formed in part of the outermost layer of the P-type well layer 103. The N-type source layer 105 has a higher impurity concentration than that of the N-type drift layer 102. The P-type low-resistance layer 107 is formed in part of the outermost layer of the P-type well layer 103. The P-type low-resistance layer 107 has a higher impurity concentration than that of the P-type well layer 103. The source electrode 111 is formed in contact with the outermost layer of the N-type drift layer 102 in which the P-type well layer 103 is not formed, the P-type well layer 103, the N-type source layer 105, and the P-type low-resistance layer 107. Here, the interface at which the source electrode 111 has Schottky contact with the N-type drift layer 102 is assumed to be the Schottky interface 115. The P-type low-resistance layer 107 and the Schottky interface 115 sandwich the P-type well layer 103 therebetween. The P-type low-resistance layer 107 is formed from the outermost layer of the P-type well layer 103, which is closer to the Schottky interface 115 than the N-type source layer 105, to below the N-type source layer 105. The lower face of the P-type low-resistance layer 107 is located below the Schottky interface 115.

According to such a configuration, the body diode interface connected from the source electrode 111 through low resistance can be located away from the Schottky interface 115. Thus, it is possible to maintain the maximum unipolar current density while improving I2t tolerance.

Note that similar effects can also be produced even if at least one of the other configurations given as examples in the specification of the present application is appropriately added to the above-described configuration, i.e., even if other configurations that have not been mentioned in the above description, but that have been given as examples in the specification of the present application are appropriately added.

According to the above-described embodiments, the P-type low-resistance layer 107B is formed from the outermost layer of the P-type well layer 103, which is closer to the Schottky interface 115 than the N-type source layer 105, to below the N-type source layer 105 and to the inside of the P-type well layer 103, which is located farther from the Schottky interface 115 than the N-type source layer 105. According to such a configuration, the low-resistance body diode interface can be effectively located away from the Schottky interface 115. Thus, it is possible to maintain the maximum unipolar current density while improving I2t tolerance.

According to the above-described embodiments, the P-type low-resistance layer 107A is formed from the outermost layer of the P-type well layer 103, which is closer to the Schottky interface 115 than the N-type source layer 105, to below the N-type source layer 105 and to the outermost layer of the P-type well layer 103, which is located farther from the Schottky interface 115 than the N-type source layer 105. According to such a configuration, the low-resistance body diode interface can be effectively located away from the Schottky interface 115. Thus, it is possible to maintain the maximum unipolar current density while improving I2t tolerance.

According to the above-described embodiments, the semiconductor device incudes the N-type drift layer 102, the P-type well layer 103, the N-type source layer 105, the P-type low-resistance layer 107D, and the source electrode 111. The P-type well layer 103 is formed in part of the outermost layer of the N-type drift layer 102. The N-type source layer 105 is formed in part of the outermost layer of the P-type well layer 103. The N-type source layer 105 has a higher impurity concentration than that of the N-type drift layer 102. The P-type low-resistance layer 107D is formed in part of the outermost layer of the P-type well layer 103. The P-type low-resistance layer 107D has a higher impurity concentration than that of the P-type well layer 103. The source electrode 111 is formed in contact with the outermost layer of the N-type drift layer 102 in which the P-type well layer 103 is not formed, the P-type well layer 103, the N-type source layer 105, and the P-type low-resistance layer 107D. Here, the interface at which the source electrode 111 has Schottky contact with the N-type drift layer 102 is assumed to be the Schottky interface 115. The P-type low-resistance layer 107D and the Schottky interface 115 sandwich the P-type well layer 103 therebetween. The P-type low-resistance layer 107D is formed in a region that includes the inside of the P-type well layer 103 that is located farther from the Schottky interface 115 than the N-type source layer 105. The lower face of the P-type low-resistance layer 107D is located below the Schottky interface 115.

According to such a configuration, the low-resistance body diode interface can be located away from the Schottky interface 115. Thus, it is possible to maintain the maximum unipolar current density while improving I2t tolerance.

Note that similar effects can also be produced even if at least one of the other configurations given as examples in the specification of the present application is appropriately added to the above-described configuration, i.e., even if other configurations that have not been mentioned in the above description, but that have been given as examples in the specification of the present application are appropriately added.

According to the above-described embodiments, the P-type low-resistance layer 107C is formed in the region that includes the outermost layer of the P-type well layer 103, which is located farther from the Schottky interface 115 than the N-type source layer 105. According to such a configuration, the low-resistance body diode interface can be effectively located away from the Schottky interface 115. Thus, it is possible to maintain the maximum unipolar current density while improving I2t tolerance.

According to the above-described embodiments, the depth of at least one of concentration peaks in the P-type low-resistance layer 107 is greater than the depth of every concentration peak in the N-type source layer 105. According to such a configuration, the distance between the lower face of the P-type well layer 103 and the lower face of the P-type low-resistance layer 107 decreases. and therefore the resistance value between the source electrode 111 and the low-resistance body diode interface decreases. Accordingly, I2t tolerance improves.

According to the above-described embodiments, the impurity concentration at the concentration peak in the P-type low-resistance layer 107 is 10 times or more the impurity concentration in the outermost layer of the P-type well layer 103 that is sandwiched between the N-type drift layer 102 and the N-type source layer 105. According to such a configuration, the resistance of the path along which the bipolar current flows can be reduced. Thus, it is possible to relatively increase the bipolar current density and to improve I2t tolerance.

According to the above-described embodiments, the impurity concentration at the concentration peak in the P-type low-resistance layer 107 is 100 times or more the impurity concentration in the outermost layer of the P-type well layer 103 that is sandwiched between the N-type drift layer 102 and the N-type source layer 105. According to such a configuration, the resistance of the path along which the bipolar current flows can be reduced. Thus, it is possible to relatively increase the bipolar current density and to improve I2t tolerance.

According to the above-described embodiments, the semiconductor device includes the N-type second impurity layer. The N-type second impurity layer corresponds to, for example, the N-type low-resistance layer 113. In plan view, the N-type low-resistance layer 113 is formed at least in a position overlapping the Schottky interface 115 and the P-type low-resistance layer 107 from the upper face of the N-type drift layer 102 to below the P-type well layer 103. The N-type low-resistance layer 113 has a higher impurity concentration than that of the N-type drift layer 102. According to such a configuration, the resistance value of the path from the Schottky interface 115 to the body diode interface connected through highest resistance decreases during normal operation of the semiconductor device. Therefore, the maximum unipolar current density increases. On the other hand, when a large return current flows through the semiconductor device, a large number of minority carriers are injected from the P-type well layer 103 into the N-type drift layer 102. Thus, the presence of the N-type low-resistance layer 113 reduces the influence on the resistance value of the path from the Schottky interface 115 to the body diode interface connected through highest resistance.

According to the above-described embodiments, the N-type low-resistance layer 113A is formed below the entire surface of the P-type well layer 103 in plan view. According to such a configuration, the resistance value of the path from the Schottky interface 115 to the body diode interface connected through highest resistance decreases during normal operation of the semiconductor device. Accordingly, the maximum unipolar current density increases.

According to the above-described embodiments, the semiconductor device incudes the N-type drift layer 102, the P-type first well layer, the P-type second well layer, the N-type source layer 105B, the P-type first impurity layer, the P-type second impurity layer, and the source electrode 111. The P-type first well layer corresponds to, for example, the P-type well layer 103A. The P-type second well layer corresponds to, for example, the P-type well layer 103B. The P-type first impurity layer corresponds to, for example, the P-type low-resistance layer 107F. The P-type second impurity layer corresponds to, for example, the P-type low-resistance layer 107G. The P-type well layer 103A is formed in part of the outermost layer of the N-type drift layer 102. The P-type well layer 103B is formed in part of the outermost layer of the N-type drift layer 102. The N-type source layer 105B is formed in part of the outermost layer of the P-type well layer 103B. The N-type source layer 105B has a higher impurity concentration than that of the N-type drift layer 102. The P-type low-resistance layer 107F is formed in part of the outermost layer of the P-type well layer 103A. The P-type low-resistance layer 107F has a higher impurity concentration than that of the P-type well layer 103A. The P-type low-resistance layer 107G is formed in part of the outermost layer of the P-type well layer 103B. The P-type low-resistance layer 107G has a higher impurity concentration than that of the P-type well layer 103B. The source electrode 111 is formed in contact with the outermost layer of the N-type drift layer 102 in which the P-type well layer 103A and the P-type well layer 103B are not formed, the P-type well layer 103A, the P-type well layer 103B, the N-type source layer 105B, the P-type low-resistance layer 107F, and the P-type low-resistance layer 107G. Here, the interface at which the source electrode 111 has Schottky contact with the N-type drift layer 102 is assumed to be the Schottky interface 115. The P-type low-resistance layer 107F and the Schottky interface 115 sandwich the P-type well layer 103A therebetween. The P-type low-resistance layer 107G and the Schottky interface 115 sandwich the P-type well layer 103B therebetween. The P-type low-resistance layer 107G is formed in the outermost layer of the P-type well layer 103B that is located closer to the Schottky interface 115 than the N-type source layer 105. The lateral edge portion of the P-type low-resistance layer 107F on the side farther from the Schottky interface 115 is formed at a position farther from the Schottky interface 115 than the lateral edge portion of the P-type low-resistance layer 107G on the side farther from the Schottky interface 115. The lower face of the P-type low-resistance layer 107F and the lower face of the P-type low-resistance layer 107G are located below the Schottky interface 115.

According to such a configuration, the low-resistance body diode interface can be located away from the Schottky interface 115. Thus, it is possible to maintain the maximum unipolar current density while improving I2t tolerance.

Note that similar effects can also be produced even if at least one of the other configurations given as examples in the specification of the present application is appropriately added to the above-described configuration, i.e., even if other configurations that have not been mentioned in the above description, but that have been given as examples in the specification of the present application are appropriately added.

According to the above-described embodiments, the trench 3002 is formed in the upper face of the N-type drift layer 102. The P-type low-resistance layer 107E is formed on either or both of the side wall and bottom of the trench 3002. The source electrode 111E is formed in contact with either or both of the upper and side faces of the P-type low-resistance layer 107E. According to such a configuration, the side wall of the trench 3002 in the source contact hole 120E is connected to the N-type source layer 105 and the P-type low-resistance layer 107E. Accordingly, even if the source contact hole 120E is reduced in width, the source electrode 111E can be reliably connected to the N-type source layer 105 and the P-type low-resistance layer 107E. Thus, it is possible to reduce the pitch of unit cells.

According to the above-described embodiments, the Schottky interface 115 is formed extending in the first direction (e.g., up-down direction in FIG. 10) in plan view. The P-type low-resistance layer 107E is also formed extending in the first direction (e.g., up-down direction in FIG. 10) in plan view. According to such a configuration, the area of the equivalent body diode interface 106 located farthest from the Schottky interface 115 increases. Therefore, I2t tolerance can be increased effectively by including the P-type low-resistance layer 107E.

Variations of Above-Described Embodiments

While the above-described embodiments may in some cases describe, for example, the quality, material, size, and shape of each constituent element, relative locations and arrangement of constituent elements, and conditions for implementation, these features are all illustrative in all aspects and are not limited to the examples described in the specification of the present application.

Accordingly, an unlimited number of variations and equivalents that are not exemplified are assumed to fall within the scope of the technique disclosed in the specification of the present application. For example, the scope of the technique is assumed to include cases where at least one constituent element is modified, added, or omitted and cases where at least one constituent element in at least one embodiment is extracted and combined with constituent elements in other embodiments.

In the above-described embodiments, "one" constituent element may include "one or more" constituent elements as long as no contradiction arises.

Each constituent element in the above-described embodiments is perceived as a conceptual unit, and the scope of the technique disclosed in the specification of the present application is assumed to include cases where one constituent element is configured by a plurality of structural elements, cases where one constituent element corresponds to part of a certain structural element, and cases where a plurality of constituent elements is included in one structural element.

Each constituent element described in the above-described embodiments is assumed to include structural elements having other structures or shapes as long as it can achieve the same function.

The description in the specification of the present application shall be referred to for all purposes relating to the technique of the present application, and nothing in the specification shall be regarded as conventional technology.

When features such as material names are described with no particular indication in the above-described embodiments, those materials are assumed to include other additives such as an alloy, as long as no contradiction arises.

EXPLANATION OF REFERENCE SIGNS 10, 101: N-type semiconductor substrate, 20, 102: N-type drift layer, 22, 114: Schottky region, 30, 103, 103A, 103B: P-type well layer, 35: P-type well contact layer, 40, 105, 105B: N-type source layer, 50, 108, 108A, 108B: gate insulating film, 55, 110: interlayer insulation film, 60, 109, 109A, 109B: gate electrode, 70: ohmic electrode, 71: backside ohmic electrode, 75: Schottky electrode, 80, 111, 111E: source electrode, 85, 112: drain electrode, 104: channel region, 106: body diode interface, 107, 107A, 107B, 107C, 107D, 107E, 107F, 107G: P-type low-resistance layer, 113, 113A: N-type low-resistance layer, 115: Schottky interface, 116: JFET region, 120, 120E: source contact hole, 1001, 1001A, 1001B, 1001C, 1001D, 2001, 2001A, 3001, 4001, 5000: semiconductor device, 3002: trench.

The invention claimed is:

1. A semiconductor device comprising:
a semiconductor substrate of a first conductivity type;
a drain electrode having ohmic contact with a lower face of the semiconductor substrate;
a drift layer of the first conductivity type formed on an upper face of the semiconductor substrate;
a well layer of a second conductivity type formed in part of an outermost layer of the drift layer;
a source layer of the first conductivity type formed in part of an outermost layer of the well layer and having a higher impurity concentration than that of the drift layer;
a first impurity layer of the second conductivity type formed in part of the outermost layer of the well layer and having a higher impurity concentration than that of the well layer; and
a source electrode formed in contact with the outermost layer of the drift layer in which the well layer is not formed, the well layer, the source layer, and the first impurity layer, wherein an interface at which the source electrode has Schottky contact with the drift layer is regarded as a Schottky interface, the first impurity layer and the Schottky interface sandwich the well layer therebetween, the first impurity layer is formed in the outermost layer of the well layer located closer to the Schottky interface than the source layer, to below and an inside of the well layer located farther from the Schottky interface than the source layer, and a lower face of the first impurity layer is located below the Schottky interface.

2. The semiconductor device according to claim 1, wherein
the first impurity layer is formed from the outermost layer of the well layer, located closer to the Schottky interface than the source layer, to below the source layer and to the outermost layer an inside of the well layer located farther from the Schottky interface than the source layer.

3. The semiconductor device according to claim 1, wherein
the first impurity layer is formed in a region that includes the outermost layer of the well layer located farther from the Schottky interface than the source layer.

4. The semiconductor device according to claim 1, wherein
a depth of at least one of concentration peaks in the first impurity layer, is greater than a depth of every concentration peak in the source layer.

5. The semiconductor device according to claim 1, wherein
an impurity concentration at a concentration peak in the first impurity layer, is 10 times or more an impurity concentration in the outermost layer of the well layer that is sandwiched between the drift layer and the source layer.

6. The semiconductor device according to claim 1, wherein
an impurity concentration at a concentration peak in the first impurity layer is 100 times or more an impurity concentration in the outermost layer of the well layer that is sandwiched between the drift layer and the source layer.

7. The semiconductor device according to claim 1, further comprising:
a second impurity layer of the first conductivity type formed at least in a position overlapping the Schottky interface and the first impurity layer from the upper face of the drift layer to below the well layer in plan view and having a higher impurity concentration than that of the drift layer.

8. The semiconductor device according to claim 7, wherein the second impurity layer is formed below an entire surface of the well layer in plan view.

9. The semiconductor device according to claim 1, wherein
a trench is formed in an upper face of the drift layer,
the first impurity layer is formed on either a side wall or a bottom of the trench, and
the source electrode is formed in contact with either an upper face or a side face of the first impurity layer.

10. The semiconductor device according to claim 1, wherein
the Schottky interface is formed extending in a first direction in plan view, and
the first impurity layer is formed extending in the first direction in plan view.

11. A semiconductor device comprising:
a drift layer of a first conductivity type;
a first well layer of a second conductivity type formed in part of an outermost layer of the drift layer;
a second well layer of the second conductivity type formed in part of the outermost layer of the drift layer;
a source layer of the first conductivity type formed in part of an outermost layer of the second well layer and having a higher impurity concentration than that of the drift layer;
a first impurity layer of the second conductivity type formed in part of an outermost layer of the first well layer and having a higher impurity concentration than that of the first well layer;
a second impurity layer of the second conductivity type formed in part of the outermost layer of the second well layer and having a higher impurity concentration than that of the second well layer; and
a source electrode formed in contact with the outermost layer of the drift layer in which the first well layer and the second well layer are not formed, the first well layer, the second well layer, the source layer, the first impurity layer, and the second impurity layer,
wherein an interface at which the source electrode has Schottky contact with the drift layer is regarded as a Schottky interface,
the first impurity layer and the Schottky interface sandwich the first well layer therebetween,
the second impurity layer and the Schottky interface sandwich the second well layer therebetween,
the second impurity layer is formed in the outermost layer of the second well layer located closer to the Schottky interface than the source layer,
a lateral edge portion of the first impurity layer on a side farther from the Schottky interface is located at a position farther from the Schottky interface than a lateral edge portion of the second impurity layer on a side farther from the Schottky interface, and
a lower face of the first impurity layer and a lower face of the second impurity layer are located below the Schottky interface.

12. The semiconductor device according to claim 11, wherein
a trench is formed in an upper face of the drift layer,
the first impurity layer is formed on either a side wall or a bottom of the trench, and
the source electrode is formed in contact with either an upper face or a side face of the first impurity layer.

13. The semiconductor device according to claim 11, wherein
the Schottky interface is formed extending in a first direction in plan view, and
the first impurity layer is formed extending in the first direction in plan view.

* * * * *